United States Patent [19]

Farnbach

[11] 4,065,915

[45] Jan. 3, 1978

[54] BINARY COUNTING SYSTEM

[76] Inventor: John S. Farnbach, 756 Jefferson Ave., Loveland, Colo. 80537

[21] Appl. No.: 592,455

[22] Filed: July 2, 1975

Related U.S. Application Data

[63] Continuation of Ser. No. 368,643, June 11, 1973, abandoned.

[51] Int. Cl.² .............................................. G04C 3/00
[52] U.S. Cl. .................................... 58/23 R; 58/50 R
[58] Field of Search .................. 58/4 A, 50 R, 23 A, 58/23 R; 328/46

[56] References Cited

U.S. PATENT DOCUMENTS

| 3,664,116 | 5/1972 | Emerson et al. | 58/23 R |
| 3,672,155 | 6/1972 | Bergey et al. | 58/50 R |
| 3,707,071 | 12/1972 | Walton | 58/50 R |
| 3,754,392 | 8/1973 | Daniels | 58/50 R |
| 3,760,584 | 9/1973 | Dargent | 58/50 R |
| 3,765,163 | 10/1973 | Levine et al. | 58/50 R |

OTHER PUBLICATIONS

Benscher, et al., "Electronic Switching Theory and Circuits", pp. 63-87, Van Nostrand Reinhold Co., New York, N. Y., 1971.

Primary Examiner—Ulysses Weldon
Attorney, Agent, or Firm—Limbach, Limbach & Sutton

[57] ABSTRACT

A binary counting system applicable for a variety of applications, but particularly suitable for use in a display actuator for an electronic clock, includes circuit means for counting through a sequence of more than ten states which represent a sequence of consecutive decimal numbers in a manner that all the binary logic states representing decimal numbers with a common unit's digit are part of an exclusive sub-cube of a minterm map common only to that unit's digit.

16 Claims, 25 Drawing Figures

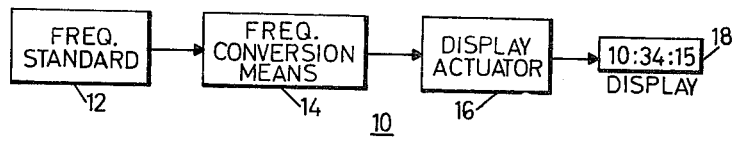
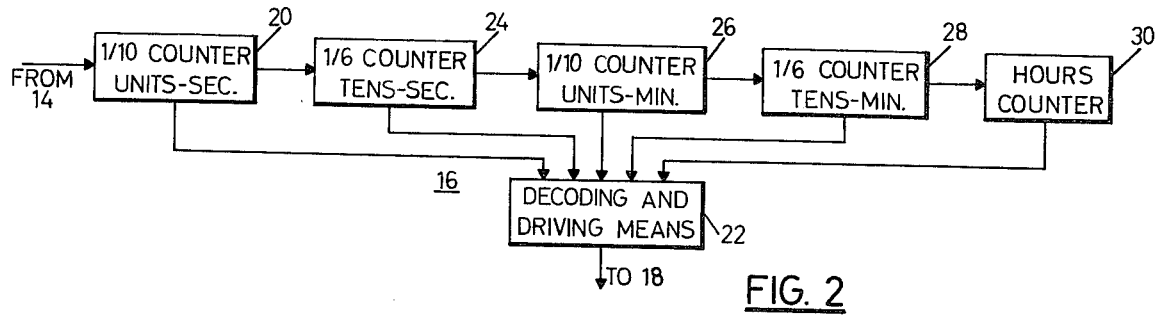
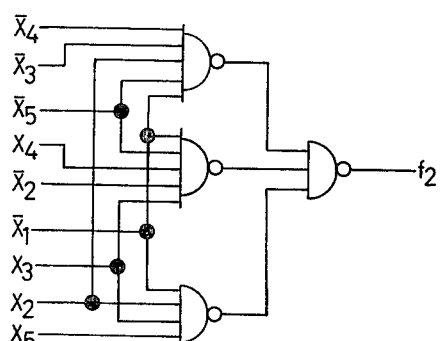
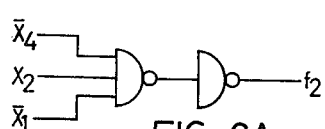

BINARY COUNTING SYSTEM

This is a continuation of application Ser. No. 368,643 Filed June 11, 1973 now abandoned.

BACKGROUND OF THE INVENTION

In many situations, electronic binary logic circuitry is used to count through a sequence of more than ten states, the states representing consecutive decimal numbers. A primary example is in an electronic timekeeping device, in which an hours counter must count through states representing the hours 00 through 23. Other examples are an electronic weight measuring and display device in which an ounces counter counts through states representing 0 through 15 ounces, and an electronic length measuring and display device in which an inches counter counts through states representing 0 through 11 inches. In the interest of simplicity, this invention is described in terms of an electronic clock and other applications, which will be apparent to one skilled in the art, are mentioned when pertinent.

A typical electronic clock functions in the following basic way. The number of output cycles from a stable frequency source is counted and the total count is appropriately displayed. In a simple case, the frequency source is just the input 60 Hz power frequency from the normal household outlet, but in some scientific applications where great accuracy is required, more precise frequency sources are used. In fact, a regular plug-in electric clock works basically in this same way; the induction motor counts the 60 Hz frequency by revolving one turn for each input cycle, and the hands display the total number of turns of the motor in terms of hours, minutes, and seconds by means of the gearing between the motor and hands.

In the case of the electronic clock, the 60 Hz frequency is counted by means of binary logic circuits which operate in stages. The simplest stage is a divide-by-two counter (1/2). If the output of a first divide-by-two counter is connected to the input of a second divide-by-two counter, and its output is connected to a third counter, the three divide-by-two counters can be considered together to be a single divide-by-eight counter (1/8). That is, the outputs of the respective divide-by-two counters can be in any one of eight states from binary 0 (000) through binary 7 (111).

A basic divide-by-two counter is the J-K flip-flop. When the clock input goes from a logical one to logical zero, the outputs Q and $\bar{Q}$ change state depending upon the control inputs J and K. By means of these J and K inputs, it is possible to make interconnection among the stages of a multistage counter to make the counter skip certain counts. For example, in the three stage divide-by-eight (1/8) counter, it is possible to interconnect the J and K inputs and the outputs of the three stages to make the counter skip the binary 6 and 7 counts so as to count from binary 0 through 5. This new counter is a 1/6 counter. An important point is that one can just as easily make the counter skip any two counts out of the sequence 0 through 7 and still come up with a 1/6 counter. The only difference is that there is a different relation between the binary outputs from each stage and the actual number of input cycles counted.

Another important part of electronic clocks is the decoding and displaying of the count. For example, suppose we have a seconds counter (1 Hz input frequency) and we want to be able to count up to at least 1000 seconds. One way to do it is to connect 10 divide-by-two (1/2) counters to count from binary 0 through 1023. However, in order to display the decimal digits 000 through 999, this method requires an extremely complex decoder to convert the binary counter output to decimal form.

A much simpler way to accomplish the same thing is to work with four-stage divide-by-ten (1/10) counters and provide a decoder for each counter, e.g., for each decimal digit. Because there are ten decimal digits 0–9, there is a much simpler relationship between the four binary outputs of each of the 1/10 counters and the corresponding decimal digit. Even though more divide-by-two counters are required in the latter scheme, the latter is simpler and more economical way of decoding.

In the latter scheme, the decoders for each of the 1/10 stages are identical and are still fairly complex and comprise a sizable amount of the cost of the counter. A substantial savings can be realized by time-sharing a single decoder. With time sharing, digit select lines are repeatedly pulsed, one after the other, to simultaneously light a display tube and gate the corresponding bits into the decoder, thus time-sharing the single decoder among all the display tubes. The digit select lines are pulsed so fast that they display tubes all appear to be lit continuously.

In an electronic clock, it is necessary to count by 1/10 (seconds, minutes), by 1/6 (tens of seconds, tens of minutes), and by 1/12 or 1/24 (hours). There are particular problems with the 1/12 or 1/24 counter because there is not a one-to-one correspondence between the count and the displayed digit. For example, the units hours digit displayed must be "2" for both the 02 and the 12 hour counts, and in the case of a 24 hour clock, the 22 hour count.

Currently, there are several techniques used to sequence the counters prior to decoding and display. Primarily, binary-coded-decimal (BCD), but also excess-three codes and a few others are used. However, these other methods were all designed to facilitate binary arithmetic operations for computer applications and the like and hence are poorly suited to digital clock applications. For example, the binary representation of a number of BCD is the binary number equal to the represented decimal number. This is fine for adding numbers, but as will be explained in greater detail subsequently, the representations of 02 and 12 turn out to be logically dissimilar, causing problems of increased decoder complexity when displaying the hours digit "2" for both the hours 02 and 12.

SUMMARY OF THE INVENTION

It is, therefore, an object of the present invention to provide an improved system for sequencing binary counters.

Another object of the invention is to provide an improved counting system which is particularly advantageous for use in electronic clocks.

Another object of the invention is to provide a counting scheme utilizing a minimum number of logic variables.

Another object of the invention is to provide an improved electronic clock.

Another object of the invention is to provide an improved display actuator for a digital clock.

In accordance with the present invention, binary logic means are provided to count through a sequence of more than ten states representing a sequence of consecutive decimal numbers and in such a manner that all of the binary logic states representing decimal numbers with a common unit's digit are a part of a sub-cube in the binary state space common to and exclusive to that unit's digit.

The primary advantage of this system is that the decoding circuitry necessary to actuate a display is much simpler than in conventional systems.

The present invention is particularly useful in electronic digital clock applications requiring divide-by-twelve or divide-by-twenty-four counters.

BRIEF DESCRIPTION OF THE DRAWINGS

FIG. 1 is a block schematic diagram of an electronic time-keeping device.

FIG. 2 is a more detailed block diagram of the display actuator block of FIG. 1.

FIG. 3 is a generalized Karnaugh or minterm map representation.

FIG. 4 is a Karnaugh or minterm map representation of binary logic states for a 24 decimal digit counter in accordance with the present invention.

FIG. 5 is a Karnaugh or minterm map representation of binary logic states for a 24 decimal digit counter in a prior art device.

FIGS. 6A and 6B illustrate a part of the logic circuitry typically used for decoding the minterm map representation of FIGS. 4 and 5, respectively.

DESCRIPTION OF THE PREFERRED EMBODIMENT

Figure 7:
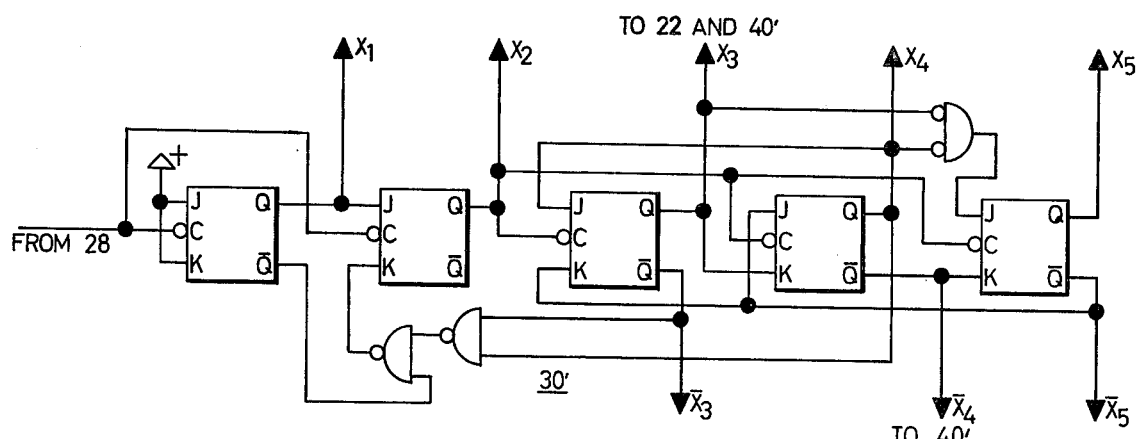
FIG. 7 is a divide-by-24 counter in accordance with the present invention.

As mentioned previously, this invention has various applications, but in the interests of simplicity and concreteness, the preferred embodiment is described in terms of its application to an electronic timekeeping device.

An overall block diagram of an electronic timekeeping device 10 in accordance with this invention is shown in FIG. 1. In this figure, a constant frequency source or standard 12 produces an output of a fixed frequency, and may be constructed by well known means. For example, U.S. Pat. No. 3,560,998 describes a frequency standard suitable for use in an electronic wrist watch. In other applications, the 60 Hz power frequency can be used as the standard for an electronic clock intended for ordinary household or office use. Frequency conversion means 14 converts the standard frequency to one convenient to drive a display actuator 16. The latter, in turn, drives a display device 18 which, in the usual case, displays the time in ordinary decimal notation.

In the case of a device which displays seconds, minutes, and hours, the input to the display actuator typically is 1 Hz, while a display of only minutes and hours would use, desirably, an input of 1/60 Hz. The frequency conversion means 14 can be constructed by well known methods. For example, U.S. Pat. No. 3,560,998 describes a frequency converter suitable for use in an electronic wrist watch, and many standard texts deal with the construction of frequency converters or "counters". See Z. Kohavi, *Switching and Finite Automata Theory*, McGraw-Hill, 1970.

The present invention is specifically concerned with the display actuator 16. A more detailed block diagram of this device is shown in FIG. 2. In the embodiment of FIG. 2, provision is made for the display of seconds as well as hours and minutes. It should be understood that if a display of seconds is not desired, the units-seconds counter 20 and the tens-of-seconds counter 24 could be eliminated and an input signal of frequency 1/60 Hz fed directly into the units-minutes counter 26. Units-seconds counter 20 is a sequential logic circuit that steps through a sequence of ten logic states, taking one step for each cycle of the 1 Hz input signal, in a cryclic manner. That is, counter 20 steps back to the first state from the tenth state. The units-seconds counter 20 outputs a set of four binary logic signals indicative of the current logic state to a decoding and driving means 22. Since a set of $n$ logic signals can assume $2^n$ distinct states, it will be seen that it is not possible to devise a units-seconds counter 20 with an output of less than four binary logic signals, and any more would be superfluous.

The units-seconds counter 20 also outputs a signal to serve as the input to a tens-of-seconds counter 24 at a frequency of 1/10 the input frequency to the units-seconds counter 20. This output must be so arranged that it causes the tens-of-seconds counter 24 to step to a new state when the units-seconds counter steps from the state representing the digit 9 to the state representing the digit 0.

The tens-of-seconds counter 24 is a sequential logic device that steps through a sequence of six logic states representing the tens of seconds digits 0 through 5. The counter 24 steps once for each cycle of the input signal, and the sequence of states is cyclic, the first state following the sixth to begin each new cycle. The tens-of-seconds counter 24 outputs a set of three binary logic signals indicative of the current logic state to the decoding and driving means 22. Three is the smallest numer of binary logic signals that can represent six different states, but it will be seen later that it may sometimes be advantageous to include a fourth "dummy" logic signal with the output of the tens-of-seconds counter 24 in order to make its output compatible with outputs from the other counters in order to make use of a single time-multiplexed decoding logic circuit in the decoding and driving means.

The tens-of-seconds counter 24 also outputs a signal to serve as the input to the units-minutes counter 26. This signal must be arranged to cause the units-minutes counter 26 to step to a new logic state when the tens-of-seconds counter 24 steps from the state representing the digit 5 to that representing the digit 0.

Taken together, the units-seconds counter 20 and the tens-of-seconds counter 24 operate in the following way. Starting in the logic states representing 00 seconds, the counters step through logic states representing 01, 02, 03, etc., until the states representing 09 seconds is reached. Upon the next cycle of its input signal, the units-seconds counter 20 changes from the states representing 9 to that representing 0, thus activating the tens-of-seconds counter 24 to step from the state representing 0 to that representing 1. Hence, the two counters 20 and 24 have stepped from the states representing 09 to those representing 10. This process is repeated until the seconds counters 20 and 24 reach the state representing 59 seconds, whereupon the next cycle of the 1 Hz input causes the counters 20 and 24 to step back to the 00-states. In the process of this last change, the tens-of-seconds counter 24 changes from the 5-state to the 0-state, which activates the units-minutes counter 26 to step to the next state, indicating the passage of one minute.

The units-minutes counter 26 and tens-of-minutes counter 28 operate in exactly the same way as the units-seconds and tens-of-seconds counters 20 and 24, respectively, and their operation will not be further described here. The output from the tens-of-minutes counter 28 activates the hours counter 30 to advance one step each time the tens-of-minutes counter 28 changes from the 5-state to the 0-state.

The hours counter 30 is a sequential logic circuit that steps through a sequence of twelve states, representing the hours 01 through 12, or a sequence of 24 states, representing the hours 00 through 23, depending on whether a twelve or a twenty-four hour time display is desired. In the interests of simplicity, only the twenty-four hour counter will be described here, and the twelve hour counter will be described subsequently as a modification on the twenty-four hour version.

Since $2^5$ equals 32, it is possible to represent the twenty-four states of the hours counter with five, but no less than five, binary logic signals. Thus, the output of the hours counter 30 is a set of at least five binary logic signals indicative of the current logic state which is fed into the decoding and driving means 22.

The decoding and driving means 22 consists of logical switching circuits to determine, based upon the binary signals from each of the counters, which digits are to be displayed in each of the various positions (e.g., tens of hours, units hours, etc.), and driving circuitry appropriate to the specific display device 18 in use.

Since each binary logic signal, or "bit", used to represent the states of a counter requires the use of some sort of binary memory device, such as flip-flop, it is desirable to represent the twenty-four states of the hours counter with only five bits. The present invention relates to a means of achieving this representation in such a way that the required decoding circuitry is more simple than is the case with counting schemes in current use. In addition, the present invention has other advantages that will be described subsequently.

In order to better understand the simplicity of decoding circuitry, consider the binary state space, the set of all possible logic states that a number of binary variables can assume. For the purpose of this patent application of subsequent claims, two logic states are adjacent if exactly one of the logic variables differs in the two states. Thus, for example, in the state space of the five logic variables $x_5$, $x_4$, $x_3$, $x_2$ and $x_1$, the state $x_5x_4x_3x_2x_1$ equals 00000 is adjacent to the state 00100, but not adjacent to the state 01100.

A convenient means of visualizing logical adjacency is the Karnaugh or minterm map representation shown in FIG. 3. Each of the squares marked A, B, A', B', etc. is a fundamental product representing one logic state. The binary variables corresponding to a fundamental product are written in the margins and above the map. For example, fundamental product B corresponds to the logic state $x_5x_4x_2x_1$ equal to 00001. Two of these fundamental products are logically adjacent if: (1) they are directly beside other, or (2) directly above and below each other, or (3) if they occupy identical positions on the portion of the map for $x_5$ equals 0 and $x_5$ equals 1. For example, the following pairs of fundamental products are adjacent: (A,B), (B,F), (Q,Q'). However, D' is not adjacent to B, nor is H adjacent to B. The relationship of adjacency extends beyond the sides and top and bottom of each half of the map as if the sides of each half of the map were connected, and the top and bottom of each half were connected. Thus, A and C are adjacent and C and K are adjacent. The significance of logical adjacency in terms of decoder simplicity will become apparent subsequently.

To specify the logical decoding switching function in the Karnaugh map from, the numbers in the margins of each half of the map are considered to represent the logic states of input variables to the decoder, and the desired logical output from the decoding circuit for each of the possible input states is written in the fundamental product square. Thus, in square B would be written the desired output when the input state is $x_5x_4x_3x_2x_1$ equals 00001, while the square F' corresponds to input state $x_5x_4x_3x_2x_1$ equals 10101. For a more detailed description of the Karnaugh map or minterm representation, reference is made to Caldwall, S. H., *Switching Circuits and Logical Design,* John Wiley and Sons, New York, 1958.

FIG. 4 shows the Karnaugh map representation of a possible arrangement of binary logic states for a twenty-four hour, hours counter 30 which has all of the advantages mentioned above for such a counter and which, as will be shown, can be easily and economically constructed. It should be understood that in FIG. 4 the variables whose values are indicated in the margins of the map are the logic signals output from the hours counter 30 to the decoding and driving means 22 and thus represent the state of the counter as well as the inputs to the decoder.

The entries in the fundamental product squares indicate the sequence of counter states as well as the hours digits which are to be displayed for each logic state. An entry of 0 indicates that the logic state is not encountered in the normal operation of the counter, and thus it is not important what digits are displayed for these logic states.

For purposes of comparison in terms of decoder simplicity, FIG. 5 shows the Karnaugh Map representation of another arrangement of logic states which does not correspond to the far simpler decoder of the present invention. The logic state representation in FIG. 5 is that in which the logic variables representing each state, when written in the order $x_5x_4x_3x_2x_1$, form the binary number equal to the decimal hours number corresponding to that state. This is an extension of the well known Binary-Coded-Decimal (BCD) representation used for the digits 0 through 9.

Now consider the decoding logic circuitry in the decoding and driving means 22. For definiteness, assume that in order to display a 2 in the units hours position, it is necessary to provide a logical signal of "1" at some point, $f_2$, in the decoding and driving means 22. This might be the case, for example, when the display 18 is of the gaseous discharge, shaped cathode type and the point $f_2$ is the base of the driving transistor of the ¢2" cathode. A digit 2 must be displayed for the three hours counts 02, 12, and 22, so the point $f_2$ must be a logical "1" for each of these count states and must be "0" for every other valid count state. FIGS. 6A and 6B show the logic circuitry necessary to achieve the realization of the $f_2$ function in the standard sum-of-products from for both the representations shown in FIG. 6A, while that for FIG. 5 is shown in FIG. 6B.

The greater simplicity of the circuit of FIG. 6A compared with that of FIG. 6B arises from the fact that the counts which possess a 2 in the units digit share a particular relationship of logical adjacency in the representation of FIG. 4. They are all members of a subcube in the Karnaugh Map representation and that subcube is unique to the units digit 2. For the purpose of this patent application and subsequent claims, a subcube of size $2^n$ in the binary state space is defined as a set of $2^n$ logic states, each one of which is adjacent to $n$ other logic states in the subcube. Referring to FIGS. 4 and 3, it is seen that all the count states with a 2 units digit in FIG. 4 are part of the subcube consisting of fundamental products C, G, C', G' of FIG. 3, and that this subcube of size four is unique to the units digit 2. This being the case, the decoder of FIG. 6A has only to decide whether the input logic variables represent a state within the CGC'G' subcube, whereas the decoder of FIG. 6B must decide if the input variables are in the fundamental product (subcube of size 1) C, the fundamental product M, or the subcube G'P'.

The logical realizations shown in FIGS. 6A and 6B are in the standard minimal sum-of-products form for a one-of-ten decoder, where the decoder produces an output on one of ten output lines to display one of ten digits. There exist many other types of decoders and realization of them that might be convenient in different circumstances. For example, some displays are of the seven-segment type, wherein the various characters are formed by selectively lighting segments in an array of seven segments. For use in this case, a decoder would have to decide which ones of the seven segments are to be lit in order to form the proper digits to be displayed. And, for any given decoder type, any of many different logical realizations might be of advantage in different situation. However, the advantages of the count representation scheme of FIG. 4 over that in FIG. 5 occur with any type of decoder and any useful realization of the decoder. This is because the logical relationship of adjacency and of all the counts with the same units digit being part of a subcube unique to that units digit is quite basic, and the advantages of the representation of FIG. 4 are not dependent upon the type of decoder used.

It should be noted that FIG. 6A does not show a complete decoder, but only that part necessary to display a 2 in the units hours display. This has been done in the interests of simplicity, since the design of decoders is well known to those skilled in the art. For example, reference is made to *Introduction to the Theory of Switching Circuits*, by E. J. McCluskey, McGraw-Hill, 1965.

It should be realized that FIG. 4 depicts only one particular representation of the count state 00 through 23 for a twenty-four hour time display in which: (1) the minimum number of logic variables is used for the representation to economize on memory devices used in counters, and (2) count states representing decimal numbers with the same units digit are members of a subcube which is common to and unique to that digit. Property (2) above is true for every units digit. For example, note that all of the count states with a zero units digit are in the subcube consisting of fundamental products AEA'E'. For the 9 units digit, all are in QQ' and for the 3 units digit all are in DHD'H'.

Other representations exist which satisfy both of these properties, but the one of FIG. 4 is to be preferred in many cases because this is a particularly simple realization of a counter to step through the indicated sequence of states which can be realized in an embodiment which is suitable for use, for example, in an electronic wrist watch, or an embodiment which is suitable for a household or office clock built of commercially available integrated circuits.

The logical realization of a counter 30' to step through the sequence shown in FIG. 4 is shown in FIG. 7. In FIG. 7 as in subsequent figures, the realization is depicted in terms of standard logic functions, such as gates and J-K flip-flops, the operation of which is well known to those skilled in the art. For example, reference is made to *Digital Electronics for Scientists*, by H. V. Malmstadt et al, W. A. Benjamin, Inc. 1962. Subsequently, realizations of the standard logic functions will be presented.

Figure 8:
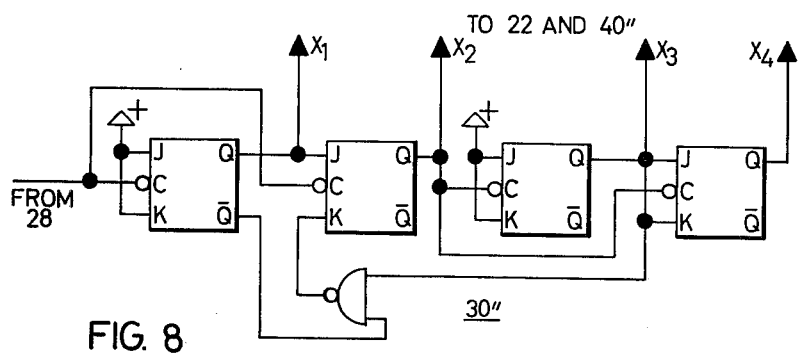
FIG. 8 illustrates a divide-by-twelve counter in accordance with the present invention.

In the event that only a twelve hour display is desired, a 1/12 hour counter is used. Such as counter 30" and its associated count representation is shown in FIG. 8. Since four bits are sufficient to represent the twelve count states, only one half of the Karnaugh map of FIG. 4 is shown there. This may be considered to be the half for $x_5$ equals 0, and it is seen that the map for the 1/12 counter 30" is compatible with that for the 1/24 counter 30' in FIG. 4. That is, of the counts which do occur in the 1/12 counter 30", they occur in the same place as those for the 1/24 counter 30'. Thus, the 1/12 counter 30" is simply a modification of the 1/24 counter 30' applies to the 1/12 counter 30". In particular, all the representations of counts with a common units digit are part of a subcube of the Karnaugh map which is common to and unique to that particular digit.

Another advantage of the 1/24 counter 30' and the 1/12 counter 30" is that there exist simple realizations of counters of other numbers of states which are compatible with the 1/24 and 1/12 counters. As a specific example of this, consider the time-multiplexed decoding arrangement of the display activator 16 shown in the block diagram of FIG. 9. This corresponds to a display of seconds, minutes and twenty-four hours. In this arrangement, the counters all function as in FIG. 2. However, the decoding and driving means 22 includes a common part, common decoding means 36, which is connected in a time sequence by time sequencing means 42 to the various counters and corresponding points in driving means 38. At any one particular time in this sequence, the decoding means 36 is connected to only one counter and to only one display digit of driving means 38. If the display driving means 38 does not include a memory and each digit in the display is lit only when the decoding means 36 is connected to it, it is usual that the time sequencing takes place so fast that all the digits appear to a human observer to be continuously lit, although this is not necessary to what follows.

Figure 9:
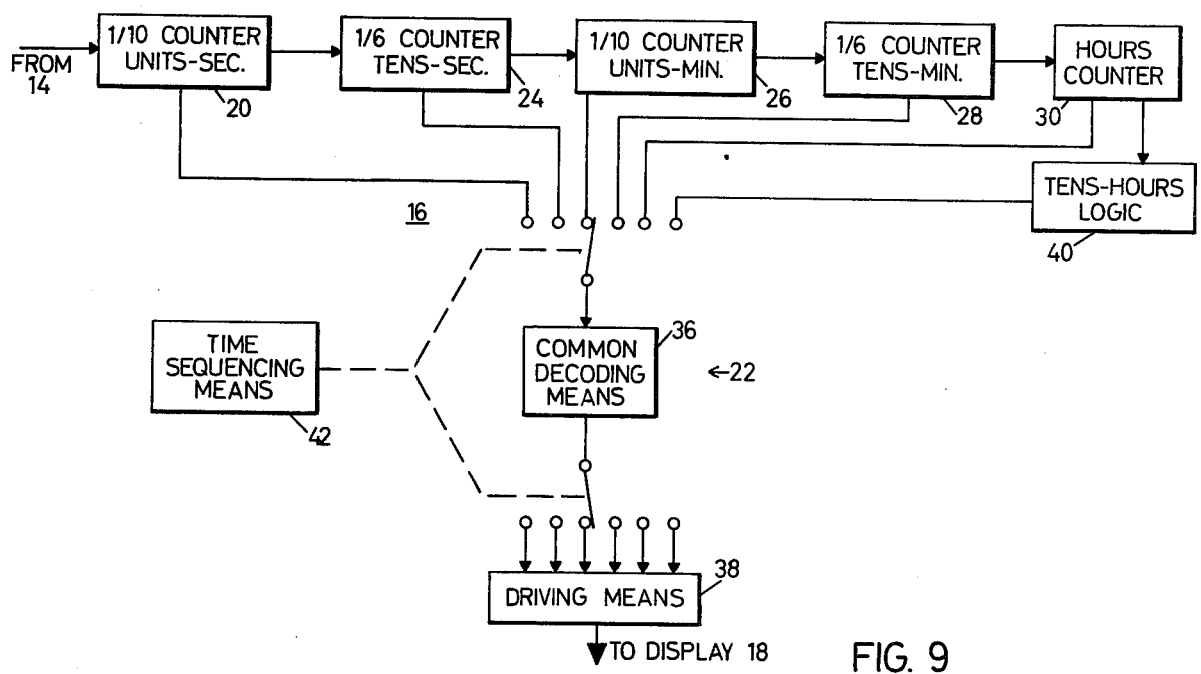
FIG. 9 is a block schematic diagram of the display actuator block of FIG. 1 utilizing time-multiplexing.

Since the same decoding circuitry 22 is used to display all the digits in FIG. 9, it is necessary that all the binary logic signals output from each counter be compatible in that the same combinations of counter output bits must represent the same digits to be displayed for every digit. The accomplish this, it is necessary to build 1/10 and 1/6 counters with outputs compatible with those of the hours counter 30, and it is also necessary to use the additional tens-of-hours logic circuit 40 to provide signals for the display of the tens-of-hours digit.

Figure 10:
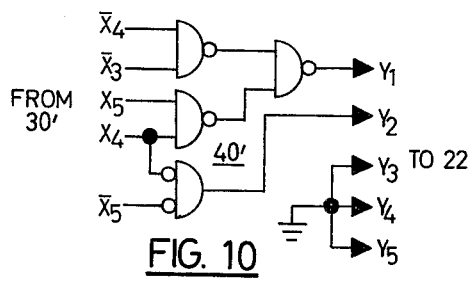
FIG. 10 is a logic circuit to provide tens-of-hours logic for the divide-by-twenty-four counter of FIG. 7.

A tens-of-hours logic circuit 40' to provide tens-of-hours logic for 1/24 hours counter 30' of FIG. 7 is shown in FIG. 10.

Figure 11:
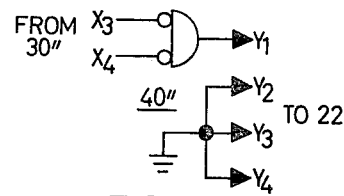
FIG. 11 is a logic circuit to provide tens-of-hours logic for the divide-by-twelve counter of FIG. 8.

A tens-of-hours logic circuit 40" for use with 1/12 hours counter 30" of FIG. 8 is shown in FIG. 11.

Figure 12:
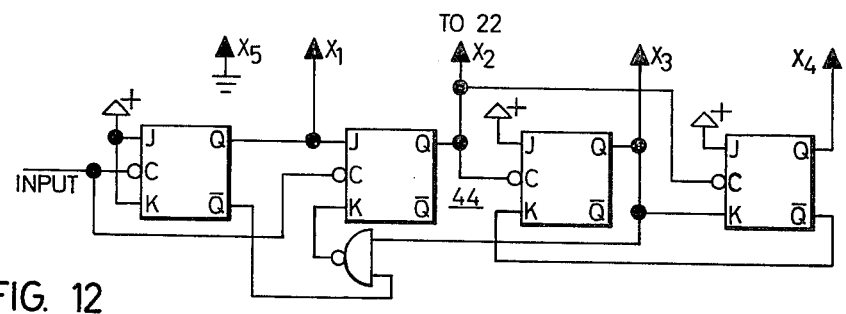
FIG. 12 is a divide-by-ten counter in accordance with the present invention.

A 1/10 counter circuit 44 which is compatible with the hours counter 30 is shown in FIG. 12, along with its count table. This circuit, for example, can be used for the units-seconds counter 20 and units-minutes counter 26.

Figure 13:
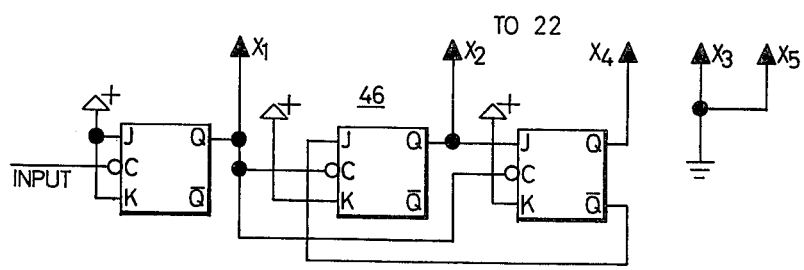
FIG. 13 is a divide-by-six counter in accordance with the present invention.

Similarly, a 1/6 counter circuit 46 which is compatible with the hours counter 30 is shown in FIG. 13, along with its count table. This circuit, for example, can be used for the tens-of-seconds counter 24 and the tens-of-minutes counter 28.

Figure 14:
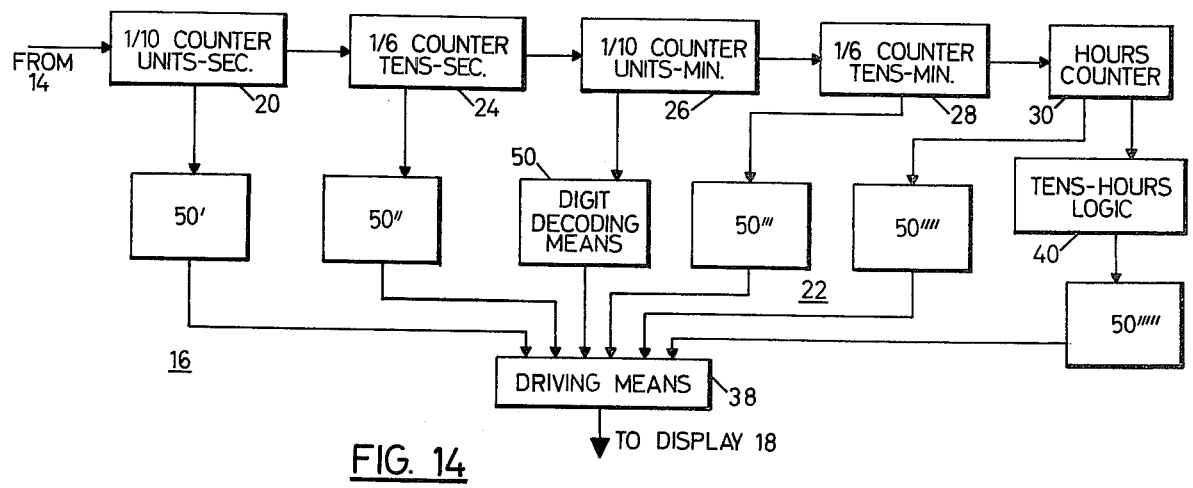
FIG. 14 is a block diagram of the display actuator block of FIG. 1, using direct decoding.

A diagram of a direct, as opposed to a multiplexed, display actuator 16 is shown in FIG. 14. The 1/6, 1/10 and hours counters are in accordance with the above description. As will be appreciated, the existence of compatible 1/6 and 1/10 counters and of simple tens-of-hours logic is an advantage in the direct display actuator as well as the time-multiplexed version. This is because all of the individual digit decoding means 50 through 50'''' are identical logic circuits providing economy of mass-producing a single type of circuit.

The logic circuits 30', 30", 40', 40", 44 and 46 can, for example, comprise a plurality of MOS transistors operating in the enhancement mode and arranged in complementary P- and N-channel pairs, with complementary transistors serving as load devices for each other. This is an arrangement particularly suited to an electronic wrist watch. A J-K flip-flop, a logical inverter, a NAND gate and a NOR gate for use in these circuits will be defined separately. These devices ae connected together in the obvious manner. In all of what follows, it should be understood that the substrate connections of integrated MOS N-channel transistors are connected to the ground terminal, while the substrate of MOS P-channel transistors is connected to the positive voltage supply.

Figure 15A:
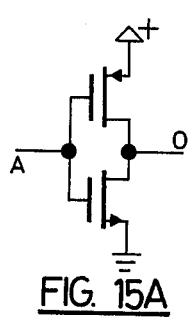
FIG. 15A is a logical inverter and FIG. 15B is its logical symbol.
Figure 15B:
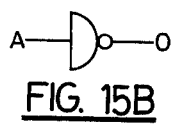

An embodiment of a logical inverter is shown in FIG. 15A and its logical symbol in FIG. 15B.

Figure 16A:
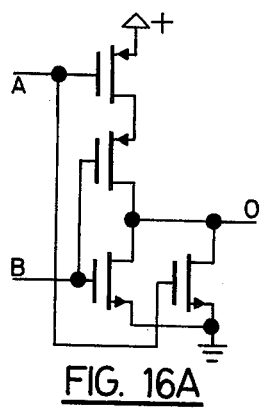
FIG. 16A is a logical NOR gate and FIG. 16B illustrates its logical symbol.
Figure 16B:
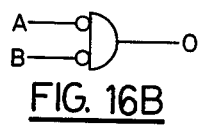

FIG. 16A is one embodiment of a logical NOR gate and FIG. 16B illustrates its logical symbol.

Figure 17A:
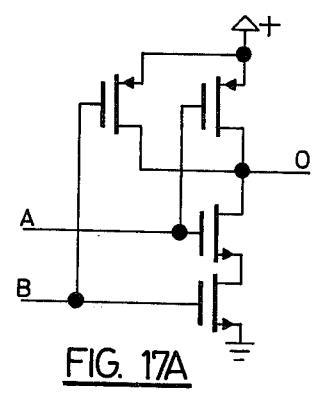
FIG. 17A is a logical NAND gate.
Figure 17B:
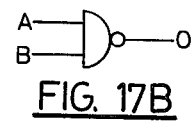
FIG. 17B illustrates its logical symbol.

An embodiment of a logical NAND gate is illustrated in FIG. 17A and its logical symbol in FIG. 17B.

Figure 18A:
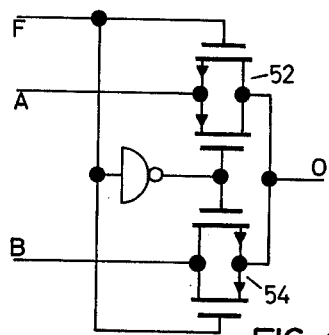
FIG. 18A is a signal control switch.
Figure 18B:
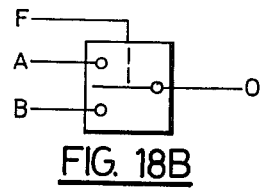
FIG. 18B shows its logical symbol.

FIG. 18A shows an embodiment of a signal control switch and its logical symbol is shown in FIG. 18B. The signal control switch works in the following way: when input F is "1", output O is connected via transistor pair 52 to input A, and when input F is "0", output O is connected to input B via transistor pair 54.

Figure 19A:
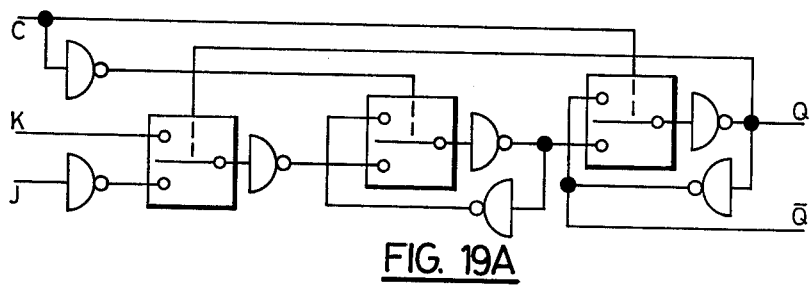
FIG. 19A is a J-K flip-flop.
Figure 19B:
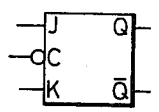
FIG. 19B shows its logical symbol.

FIG. 19A shows an embodiment of a J-K flip-flop and its logical symbol is shown in FIG. 19B.

Another embodiment of logic circuits 30', 30", 40', 40", 44 and 46 which is more suitable for use is a household or office electronic clock consists of commercially available integrated circuit logic devices. Where power consumption and size are not significant considerations in design, as they are, for example, in the case of an electronic wrist watch, the economy of mass produced integrated circuits would make this embodiment atractive. A suitable J-K flip-flop is the SP322B, manufactured by the Signetics Corp., Sunnyvale, California 94086. This device is actually a dual flip-flop, consisting of a pair of J-K flip-flops with separate clock (C) connections.

Signetics Corp. also makes the SP380A, a quad 2-input NOR gate, and the SP387A, a quad 2-input NAND gate. These devices, when connected in the obvious way dictated by the pertinent figures, gives an embodiment of the logic circuits.

As will now be appreciated, in situations where it is desired to represent a sequence of more than ten consecutive decimal numbers by means of binary logic circuitry, there are advantages in using a binary representation in which (1) the minimum number of logic variables is used to economize on memory devices used in counters, and (2) logic states representing decimal numbers with the same units digit are members of a subcube which is common to and unique to that digit, to economize on the complexity of decoding and drive circuitry. This invention has advantages in these situations as well as in the application of a timekeeping device described above.

I claim:
1. An electrically operating clock comprising:
  a. constant frequency signal source;
  b. means for converting the output cycles from said signal source to a signal of desired frequency;
  c. means for displaying units of time in ordinary decimal notation;
  d. display actuating means for driving said displaying means comprising counting means for converting said signal of desired frequency to binary signals representing at least the hours digits of the units of time, the number of said binary signals being such that one less binary signal would provide an unsufficient number of possible distinct binary logic states to represent all of said represented hours counts; and
    wherein said counting means includes means for organizing the logic states of said binary signals so that, with respect to each particular units digit, there is at least one common binary signal which assumes the same binary value in the representation of all of said hours counts possessing said particular units digit, and the common group containing all of said common binary signals is exclusive to said particular units digit in that, in the representation of every one of said hours counts not possessing said particular units digit, at least one of said binary signals belonging to said common group assumes the binary value which is distinct from said binary value which results in the representation of hours counts possessing said particular units digit; and
  wherein said binary signals representing the hours digits of the units of time are four in number and represent exactly twelve distinct hours counts.

2. An electrically operating clock as in claim 1 wherein said counting means includes additional means for converting said desired frequency signal to a first set of four binary signals representing the units minutes digits of the units of time and a second set of three binary signals representing the tens minutes digits of the units of time, wherein said sets of binary signals are compatible with said four binary signals representing the hours digits so that the same combinations of binary signals represent the same digits to be displayed for every digit.

3. An electrically operating clock as in claim 2 wherein said display actuating means additionally includes:
   a. a single electronic decoder device responsive to said counting means to drive said display means;
   b. first means for sequentially making said decoder responsive to said first set of binary signals, said second set of binary signals, and said four binary signals representing the hours digits; and
   c. second means for sequentially making the appropriate digits displayed by said display means responsive to said decoder, said second means being in synchronization with said first means to provide a multiplexed decimal output display.

4. An electrically operating clock as in claim 2 wherein said twelve distinct hours values are one through twelve, and wherein said counting means includes further means for further organizing the logic states of said four binary signals representing the hours digits so that said common groups of binary signals for units digit 1 and units digit 2 each consist of three signals.

5. An electrically operating clock as in claim 1 wherein said twelve distinct hours values are one through twelve, and wherein said counting means includes further means for further organizing the logic states of said four binary signals representing the hours digits so that said common groups of binary signals for units digit 1 and units digit 2 each consist of three signals.

6. An electrically operating clock comprising:
   a. constant frequency signal source;
   b. means for converting the output cycles from said signal source to a signal of desired frequency;
   c. means for displaying units of time in ordinary decimal notation;
   d. display actuating means for driving said displaying means comprising counting means for converting said signal of desired frequency to binary signals representing at least the hours digits of the units of time, the number of said binary signals being such that one less binary signal would provide an insufficient number of possible distinct binary logic states to represent all of said represented hours counts; and
   wherein said counting means includes means for organizing the logic states of said binary signals so that, with respect to each particular units digit, there is at least one common binary signal which assumes the same binary value in the representation of all of said hours counts possessing said particular units digit, and the common group containing all of said common binary signals is exclusive to said particular units digit in that, in the representation of every one of said hours counts not possessing said particular units digit, at least one of said binary signals belonging to said common group assumes the binary value which is distinct from said binary value which results in the representation of hours counts possessing said particular units digit; and wherein said binary signals representing the hours digits of the units of time are five in number and represent exactly twenty-four distinct hours counts.

7. An electrically operated clock as in claim 6 wherein said counting means includes additional means for converting said desired frequency signal to a first set of four binary signals representing the units minutes digits of the units of time and a second set of three binary signals representing the tens minutes digits of the units of time, wherein, said sets of binary signals are compatible with said five binary signals representing the hours digits so that the same combinations of binary signals represent the same digits to be displayed for every digit.

8. An electrically operating clock as in claim 7 wherein said actuator means additionally includes:
   a. a single electronic decoder device responsive to said couting means to drive said display means;
   b. first means for sequentially making said decoder responsive to said first set of binary signals, said second set of binary signals, and said five binary signals representing the hours digits; and
   c. second means for sequentially making the appropriate digits displayed by said display means responsive to said decoder, said second means being in synchronization with said first means to provide a multiplexed decimal output display.

9. An electronically operating clock as in claim 7 wherein said twenty-four distinct hours values are zero through twenty-three, and wherein said counting means includes further means for further organizing the logic states of said five binary signals representing the hours digits so that said common groups of binary signals for units digits 0, 1, 2, and 3 each consist of three binary signals, while said common groups for units digits 4, 5, 6, 7, 8, and 9 each consist of four binary signals.

10. An electrically operating clock as in claim 6 wherein said twenty-four distinct hours values are zero through twenty-three, and wherein said counting means includes further means for further organizing the logic states of said five binary signals representing the hours digits so that said common groups of binary signals for units digits 0, 1, 2, and 3 each consist of three binary signals, while said common groups for units digits 4, 5, 6, 7, 8, and 9 each consist of four binary signals.

11. An electrically operating clock comprising:
   a. a constant frequency signal source;
   b. means for converting the output cycles from said signal source to a signal of desired frequency;
   c. means for displaying units of time in ordinary decimal notation;
   d. display actuating means for driving said displaying means comprising counting means for converting said signal of desired frequency to binary signals representing at least the hours digits of the units of time, the number of said binary signals being such that one less binary signal would provide an insufficient number of possible distinct binary logic states to represent all of said represented hours counts; and
   wherein said counting means includes means for organizing the logic states of said binary signals so that, with respect to at least one particular units digit, which occurs more than once among said hours counts, there is at least one common binary signal which assumes the same binary value in the representation of all of said hours counts possessing said particular units digit, and the common group containing all of said common binary signals is exclusive to said particular units digit in that, in the representation of every one of said hours counts not possessing said particular units digit, at least one of said binary signals belonging to said common group assumes the binary value which is distinct from said binary value which results in the representation of hours counts possessing said particular units digit; and wherein said binary signals representing the hours digits of the units of time are four in number and represent exactly twelve distinct hours counts.

12. An electrically operating clock as in claim 11 wherein said counting means includes additional means for converting said desired frequency signal to a first set of four binary signals representing the units minutes digits of the units of time and a second set of three binary signals representing the tens minutes digits of the units of time, wherein said sets of binary signals are compatible with said four binary signals representing the hours digits so that the same combination of binary signals represent the same digits to be displayed for every digit.

13. An electrically operating clock as in claim 12 wherein said display actuating means additionally includes:
 a. a signal electronic decoder device responsive to said counting means to drive said display means;
 b. first means for sequentially making said decoder responsive to said first set of binary signals, said second set of binary signals, and said four binary signals representing the hours digits; and
 c. second means for sequentially making the appropriate digits displayed by said display means responsive to said decoder, said second means being in synchronization with said first means to provide a multiplexed decimal output display.

14. An electrically operating clock comprising:
 a. a constant frequency signal source;
 b. means for converting the output cycles from said signal source to a signal of desired frequency;
 c. means for displaying units of time in ordinary decimal notation;
 d. display actuating means for driving said displaying means comprising counting means for converting said signal of desired frequency to binary signals representing at least the hours digits of the units of time, the number of said binary signals being such that one less binary signal would provide an insufficient number of possible distinct binary logic states to represent all of said represented hours counts; and wherein said counting means includes means for organizing the logic states of said binary signals so that, with respect to at least one particular units digit, which occurs more than once among said hours counts, there is at least one common binary signal which assumes the same binary value in the representation of all of said hours counts possessing said particular units digit, and the common group containing all of said common binary signals is exclusive to said particular units digit in that, in the representation of every one of said hours counts not possessing said particular units digit, at least one of said binary signals belonging to said common group assumes the binary value which is distinct from said binary value which results in the representation of hours counts possessing said particular units digit; and wherein said binary signals representing the hours digits of the units of time are five in number and represent exactly twenty-four distinct hours counts.

15. An electrically operating clock as in claim 14 wherein said counting means includes additional means for converting said desired frequency signal to a first set of four binary signals representing the units minutes digits of the units of time and a second set of three binary signals representing the tens minutes digits of the units of time, and wherein said sets of binary signals are compatible with said five binary signals representing the hours digits so that the same combinations of binary signals represent the same digits to be displayed for every digit.

16. An electrically operating clock as in claim 15 wherein said actuator means additionally includes:
 a. a single electronic decoder device responsive to said counting means to drive said display means;
 b. first means for sequentially making said decoder responsive to said first set of binary signals, said second set of binary signals, and said five binary signals representing the hours digits; and
 c. second means for sequentially making the appropriate digits displayed by said display means responsive to said decoder, said second means being in synchronization with said first means to provide a multiplexed decimal output display.

* * * * *